(12) United States Patent
Chiang et al.

(10) Patent No.: US 10,304,540 B1
(45) Date of Patent: May 28, 2019

(54) MEMORY DEVICE AND OPERATION METHOD THEREOF

(71) Applicant: MACRONIX INTERNATIONAL CO., LTD., Hsinchu (TW)

(72) Inventors: Chih-He Chiang, Zhubei (TW); Yi-Ching Liu, Hsinchu (TW)

(73) Assignee: MACRONIZ INTERNTAIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/841,688

(22) Filed: Dec. 14, 2017

(51) Int. Cl.
| | |
|---|---|
| *G11C 16/04* | (2006.01) |
| *G11C 16/12* | (2006.01) |
| *G11C 11/4074* | (2006.01) |
| *G11C 11/4096* | (2006.01) |
| *G11C 7/06* | (2006.01) |
| *G06F 13/40* | (2006.01) |
| *G11C 7/12* | (2006.01) |

(52) U.S. Cl.
CPC .......... *G11C 16/12* (2013.01); *G06F 13/4004* (2013.01); *G11C 7/06* (2013.01); *G11C 7/12* (2013.01); *G11C 11/4074* (2013.01); *G11C 11/4096* (2013.01); *G11C 16/0483* (2013.01)

(58) Field of Classification Search
CPC .................................................. G11C 11/5628
USPC ..................................................... 365/185.18
See application file for complete search history.

(56) References Cited

U.S. PATENT DOCUMENTS

| | | | |
|---|---|---|---|
| 8,503,232 B2 * | 8/2013 | Yang .................... | G11C 11/5628 365/185.03 |
| 9,135,968 B2 | 9/2015 | Lee et al. | |
| 2002/0075727 A1* | 6/2002 | Jeong ..................... | G11C 16/10 365/185.28 |
| 2010/0214837 A1* | 8/2010 | Sako ....................... | G11C 5/147 365/185.03 |
| 2012/0314506 A1* | 12/2012 | Baek ........................ | G11C 7/12 365/185.25 |
| 2013/0336056 A1* | 12/2013 | Maeda ............... | G11C 16/3404 365/185.2 |
| 2018/0218774 A1* | 8/2018 | Kimura .................. | G11C 16/10 |
| 2018/0277220 A1* | 9/2018 | Nakagawa ............. | G11C 16/10 |

OTHER PUBLICATIONS

TW Office Action dated Jul. 3, 2018 in Taiwan application (No. 106143909).

* cited by examiner

*Primary Examiner* — Min Huang
(74) *Attorney, Agent, or Firm* — McClure, Qualey & Rodack, LLP

(57) ABSTRACT

A memory device includes a memory array including a number of memory cell strings, a number of bit lines, a number of pre-charge circuits coupled to the memory cell strings, and a number of sense amplifier circuits coupled to the memory cell strings through the bit lines. Each memory cell string includes at least one first select transistor, a second select transistor and at least one memory cell. Each bit line includes a third select transistor, and is coupled to a memory cell string. During a pre-charging stage, the pre-charge circuits provide a first voltage to pre-charge the memory cell strings. During a programming stage, for the memory cell strings to be inhibited, the sense amplifier circuits provide a second voltage lower than the first voltage. For the memory cell strings to be programmed, the sense amplifier circuits provide a third voltage lower than the second voltage.

10 Claims, 7 Drawing Sheets

US 10,304,540 B1

MEMORY DEVICE AND OPERATION METHOD THEREOF

BACKGROUND OF THE INVENTION

Field of the Invention

The invention relates to memory device and operation method thereof. Especially, the invention relates to memory device comprising pre-charge circuit and operation method thereof.

Description of the Related Art

A memory device is one of important hardware component in a computer device. The memory device typically contains a plurality of memory cell strings, each memory cell string typically comprising a plurality of memory cells and at least one string select transistor for connecting a string select line (SSL). The string selection transistor is typically disposed between the memory cell and the sense amplifier circuit. In some memory architectures, such as three-dimensional memory architecture, the threshold voltage distribution of the string select transistor is difficult to adjust by programming. However, the threshold voltage distribution of the sting select transistor will affect the threshold voltage distribution of other memory cells, and it is relatively important. Therefore, how to make the threshold voltage of the string select transistor in the desired position has been one of the industry research subjects.

SUMMARY OF THE INVENTION

The present invention discloses a memory device and an operation method thereof, which is possible to adjust the threshold voltage of first select transistors by using pre-charge circuits.

An embodiment of the present invention discloses a memory device comprising a memory array, a plurality of bit lines, a plurality of pre-charge circuit and a plurality of the sense amplifier circuits. The memory array comprises a plurality of memory blocks. Each of memory blocks comprises a plurality of memory cell strings. Each of the memory cell strings comprises at least one first select transistor and a second select transistor. At least one memory cell is disposed in series between the at least one first select transistor and the second select transistor. Each of the bit lines comprises a third select transistor, and is coupled to one of the memory cell strings. The pre-charge circuits are coupled to the memory cell strings. The sense amplifier circuits are coupled to the memory cell strings through the bit lines. During a pre-charging stage, the pre-charge circuits pre-charge the memory cell strings by a first voltage. During a programming stage after the pre-charging stage, for the memory cell strings to be inhibited, the corresponding sense amplifier circuits provide a second voltage, for the memory cell strings to be programmed, the corresponding sense amplifier circuits provide a third voltage, the first voltage is higher than the second voltage, and the second voltage is higher than the third voltage.

An embodiment of the present invention discloses an operation method of memory device. The operation method is applied to operate a memory device comprising a plurality of memory cell strings and a plurality of sense amplifier circuit. The operation method comprises following steps: during a pre-charging stage, pre-charging the memory cell strings by a first voltage; and during a programming stage, for the memory cell strings to be inhibited, the corresponding sense amplifier circuits providing a second voltage, for the memory cell strings to be programmed, the corresponding sense amplifier circuits providing a third voltage. The first voltage is higher than the second voltage, and the second voltage is higher than the third voltage.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
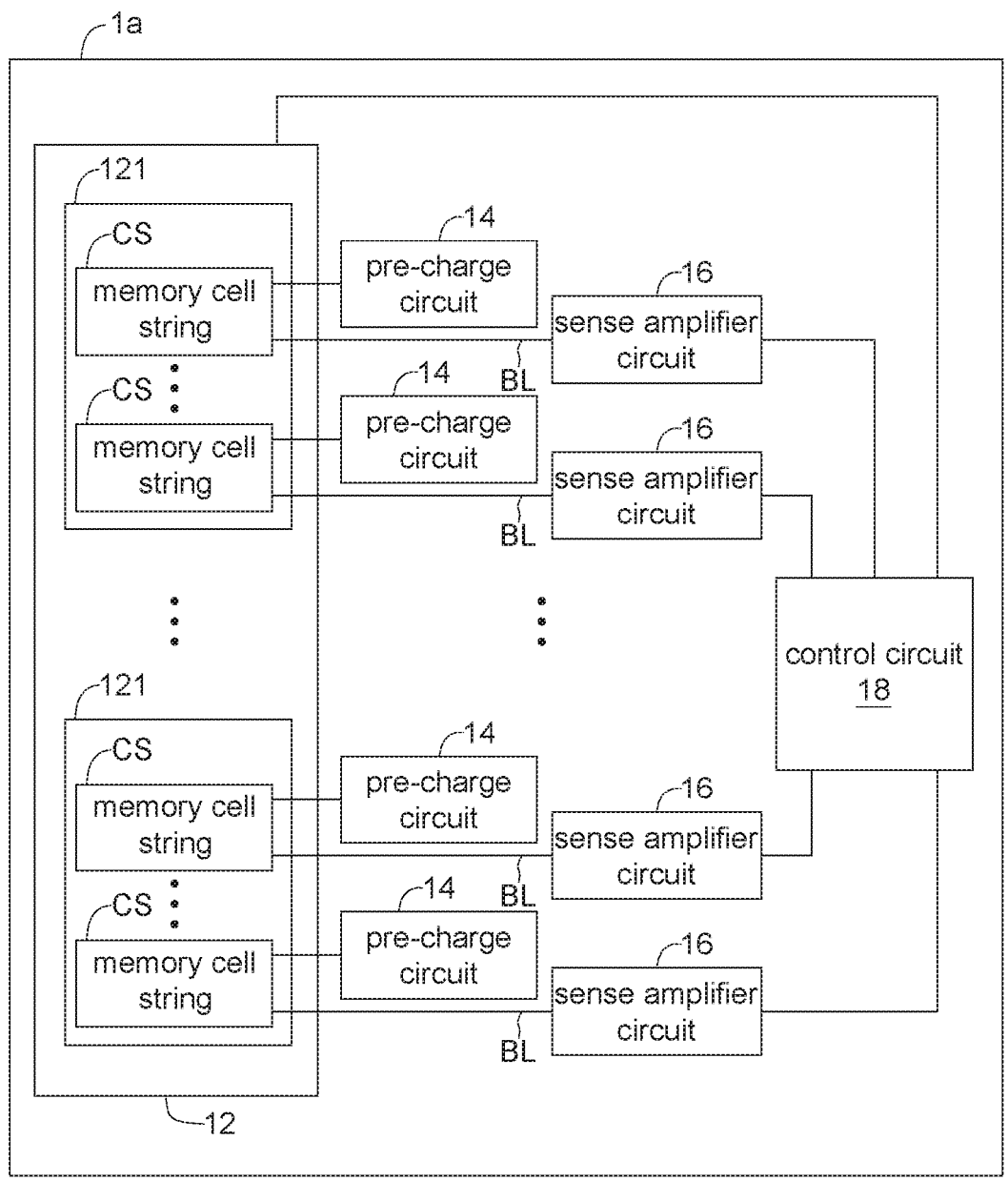
FIG. 1 shows a block diagram of a memory device according to first embodiment of the present invention.

Referring to FIG. 1, FIG. 1 shows a block diagram of a memory device according to first embodiment of the present invention. A memory device 1a includes a memory array 12, a number of bit lines BL, a number of pre-charge circuits 14, a number of sense amplifier circuits 16 and a control circuit 18.

The memory array 12 includes a number of memory blocks 121. Each memory blocks includes a number of memory cell string CS. Each memory cell string is coupled to one bit line BL and one pre-charge circuit 14.

In the first embodiment, each sense amplifier circuit 16 is coupled to one memory cell string CS through one bit line BL. The control circuit 18 is coupled to the memory array 12, the bit lines BL, the pre-charge circuit 14 and the sense amplifier circuit 16. The control circuit 18 is configured to operate the memory array 12, the bit lines BL, the pre-charge circuit 14 and the sense amplifier circuit 16.

Figure 2:
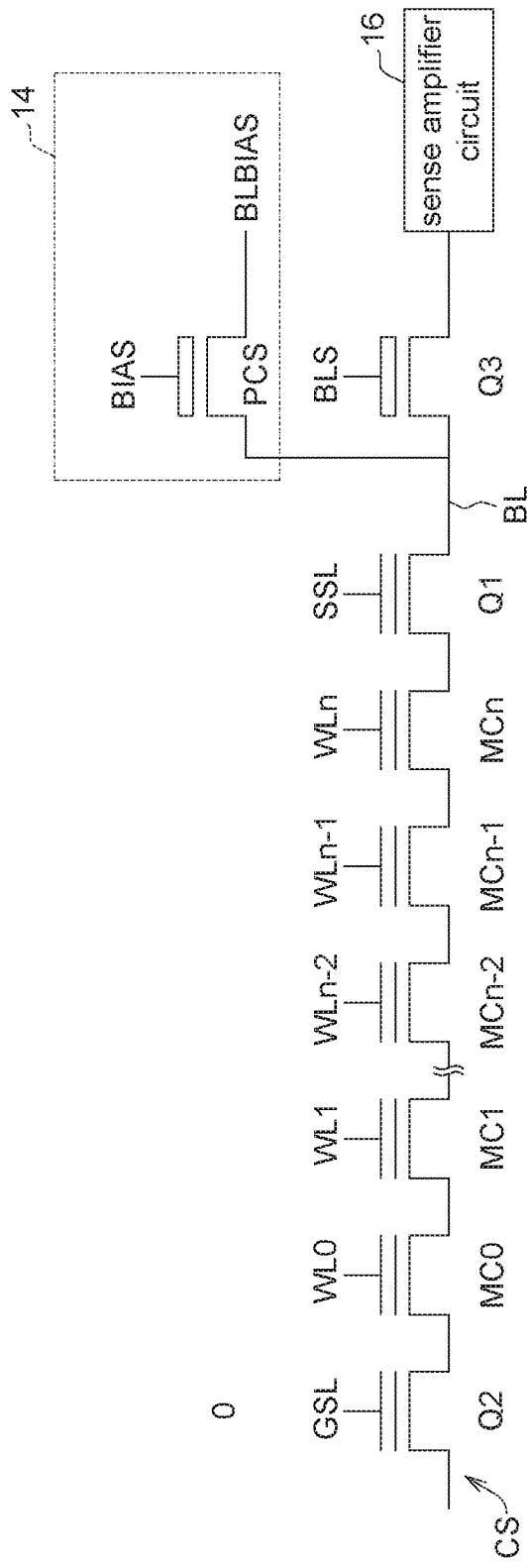
FIG. 2 shows a block diagram of partition of a memory device according to first embodiment of the present invention.

Furthermore, referring to FIG. 2, each memory cell string CS includes a first select transistor Q1, a second select transistor Q2 and a number of memory cells MC0~MCn. The memory cells MC0~MCn are disposed in series between the first select transistor Q1 and the second select transistor Q2. Each of the memory cells MC0~MCn is coupled to a word line WL0~WLn. The first select transistor Q1 is coupled to a string select line SSL. The second select transistor Q2 is coupled to a ground select line GSL.

Each bit line BL includes a third select transistor Q3. The third select transistor Q3, for example, is a high voltage transistor which is controlled by a bit line select signal BLS.

The pre-charge circuit 14 includes at least one pre-charge switch PCS which may be a high voltage transistor. A first node of the pre-charge switch PCS is coupled to a voltage source (not shown). A second node of the pre-charge switch PCS is coupled to the first select transistor Q1 of the memory cell string CS and the third select transistor Q3 of the bit line BL. A third node of the pre-charge switch PCS is configured to receive a switch control signal BIAS, so that the pre-charge switch PCS is control by the switch control signal BIAS.

Figure 3:
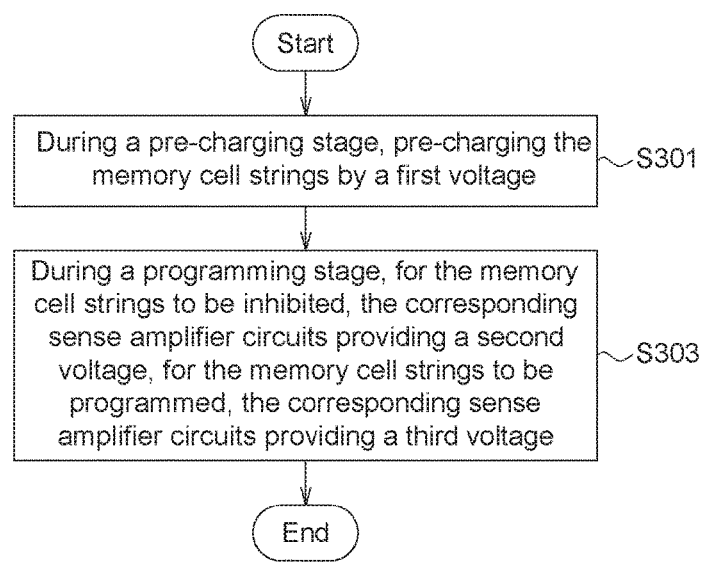
FIG. 3 shows a flow chart of operation method of a memory device according to first embodiment of the present invention.

Referring to FIG. 3, FIG. 3 shows a flow chart of operation method of a memory device according to first embodiment of the present invention. The operation method includes step S301 and step S303.

In step S301, during a pre-charging stage, pre-charging the memory cell strings by a first voltage is performed. Also referring to timing diagram shown in FIG. 4, during the pre-charging stage, the voltage source is turned on, so that the voltage of the first node of the pre-charge switch PCS is raised from low potential (e.g., 0V) to the first voltage V1. The switch control signal BIAS is raised from low potential (e.g., 0V) to high potential (e.g., the first voltage V1 plus the threshold voltage Vt of the pre-charge switch PCS), so that the pre-charge switch PCS is turned on, and the first voltage V1 may be able to pass through. The bit line select signal BLS may be kept low potential (e.g., 0V), so that the third select transistor Q3 is kept off to block the first voltage V1 to be inputted to the sense amplifier circuit 16. The string select line SSL and the word lines WL0~WLn is applied a pass voltage Vpass, so that the memory cell string CS may be pre-charged to the first voltage V1.

Figure 4:
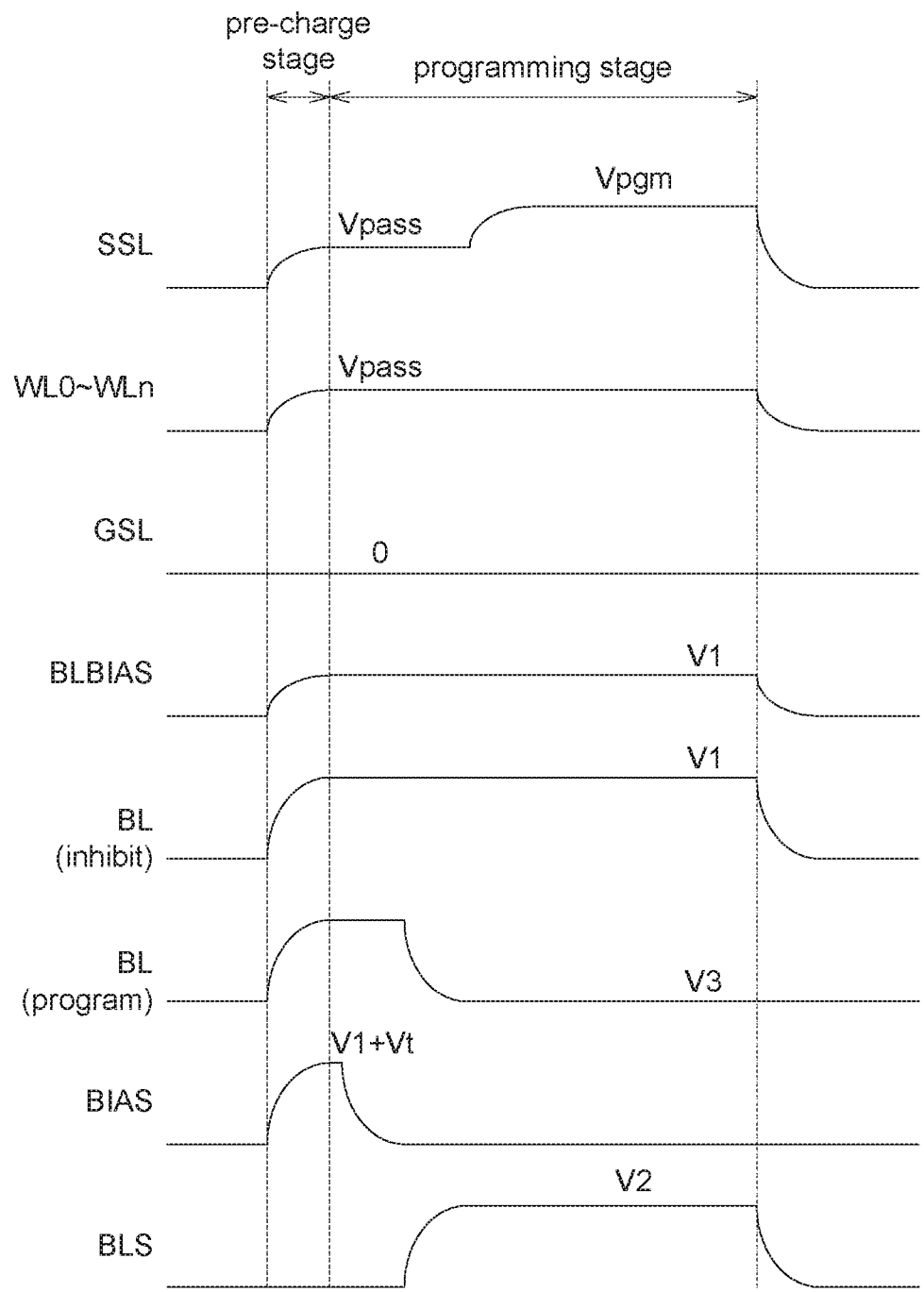
FIG. 4 shows a timing diagram of a memory device according to first embodiment of the present invention.

In step S303, during a programming stage, for the memory cell strings to be inhibited, the corresponding sense amplifier circuits providing a second voltage, for the memory cell strings to be programmed, the corresponding sense amplifier circuits providing a third voltage is performed. As shown in FIG. 4, when the pre-charging is done, the switch control signal BIAS is reduced from high potential to low potential to turn off the pre-charge switch PCS. The voltage of the first node of the pre-charge switch PCS is kept high potential to make sure that the pre-charge switch PCS is turned off. The bit line select signal BLS is raised from low potential (e.g., 0V) to high potential (e.g., the second voltage V2) to turn on the third select transistor Q3. The sense amplifier circuit 16 determines whether or not to program the first select transistor Q2 according to the threshold voltage of the first select transistor Q1. To be mentioned, the voltage provided by the sense amplifier circuit 16 is for one bit line BL, i.e., the entire memory cell string CS. In other words, the sense amplifier circuit 16 inhibiting/programming the first select transistor Q1 of the memory cell string CS is equivalent to inhibiting/programming the memory cell string CS. When the threshold voltage of the first select transistor Q1 is higher than or equal to a threshold value which means that the threshold voltage of the first select transistor Q1 has met the requirement, the sense amplifier circuit 16 may inhibit the first select transistor Q1 of the memory cell string CS to be programmed. For the memory cell string CS to be inhibited, the sense amplifier circuit 16 provides a second voltage V2, so that the voltage of the memory cell string CS (i.e., voltage of the bit line BL) may be kept the first voltage V1. In the contrary, when the threshold voltage of the first select transistor Q1 is lower than the threshold value which means that the threshold voltage of the first select transistor Q1 has not met the requirement, the sense amplifier circuit 16 may program the first select transistor Q1 of the memory cell string CS to adjust the threshold voltage of the first select transistor Q1. For the memory cell string CS to be programmed, the sense amplifier circuit 16 provides a third voltage V3, so that the voltage of the memory cell string CS (i.e., voltage of the bit line BL) may be reduced to low potential (e.g., the third voltage V3). Then, the string select line SSL is applied a program voltage Vpgm which is higher than the pass voltage Vpass. If the memory cell string CS is to be inhibited, the difference between the program voltage Vpgm and the first voltage V1 is lower than the threshold voltage of the first select transistor Q1, so that the first select transistor Q1 may not be programmed. In the contrary, if the memory cell string CS is to be programmed, the difference between the program voltage Vpgm and the third voltage V3 is higher than or equal to the threshold voltage of the first select transistor Q1, so that the first select transistor Q1 may be programmed.

Generally, since the inner elements of the sense amplifier circuit 16 is low voltage transistor which may not be able to load high voltage. Therefore, the second voltage V2 that the sense amplifier circuit 16 can provide is generally not high, e.g., 2.5V~3V. The third voltage V3, e.g., 0V, is lower than the second voltage V2. The first voltage V1 is higher than the second voltage V2, so that the difference between the voltage of the string select line SSL and the voltage of the bit line BL is reduced, and the probability of the threshold voltage fluctuation of the first selected transistor Q1 is reduced thereby.

Figure 5:
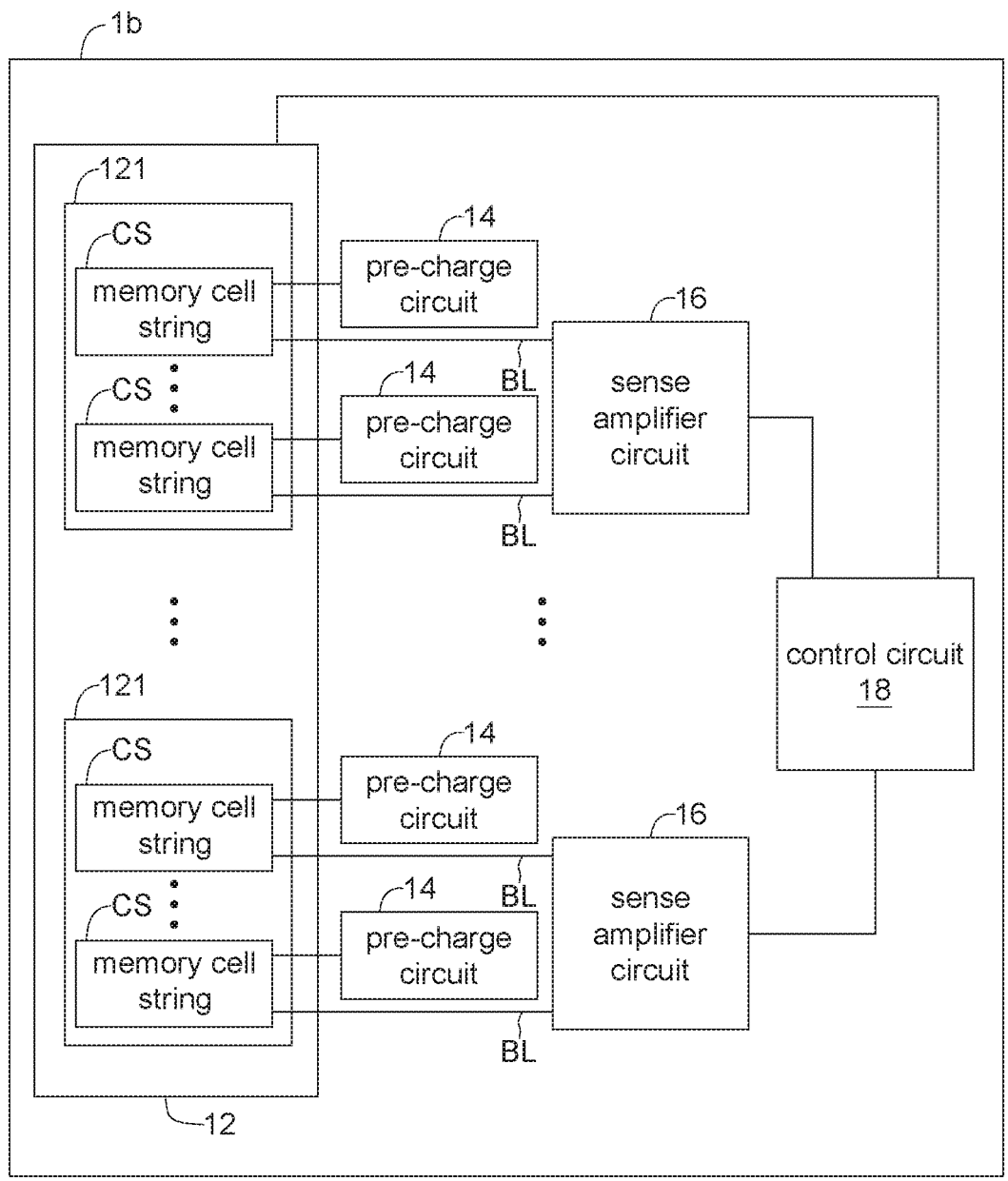
FIG. 5 shows a block diagram of a memory device according to second embodiment of the present invention.

Referring to FIG. 5, FIG. 5 shows a block diagram of a memory device according to second embodiment of the present invention. The memory device 1b is similar to the memory device 1a, the differences may be described below.

Figure 6:
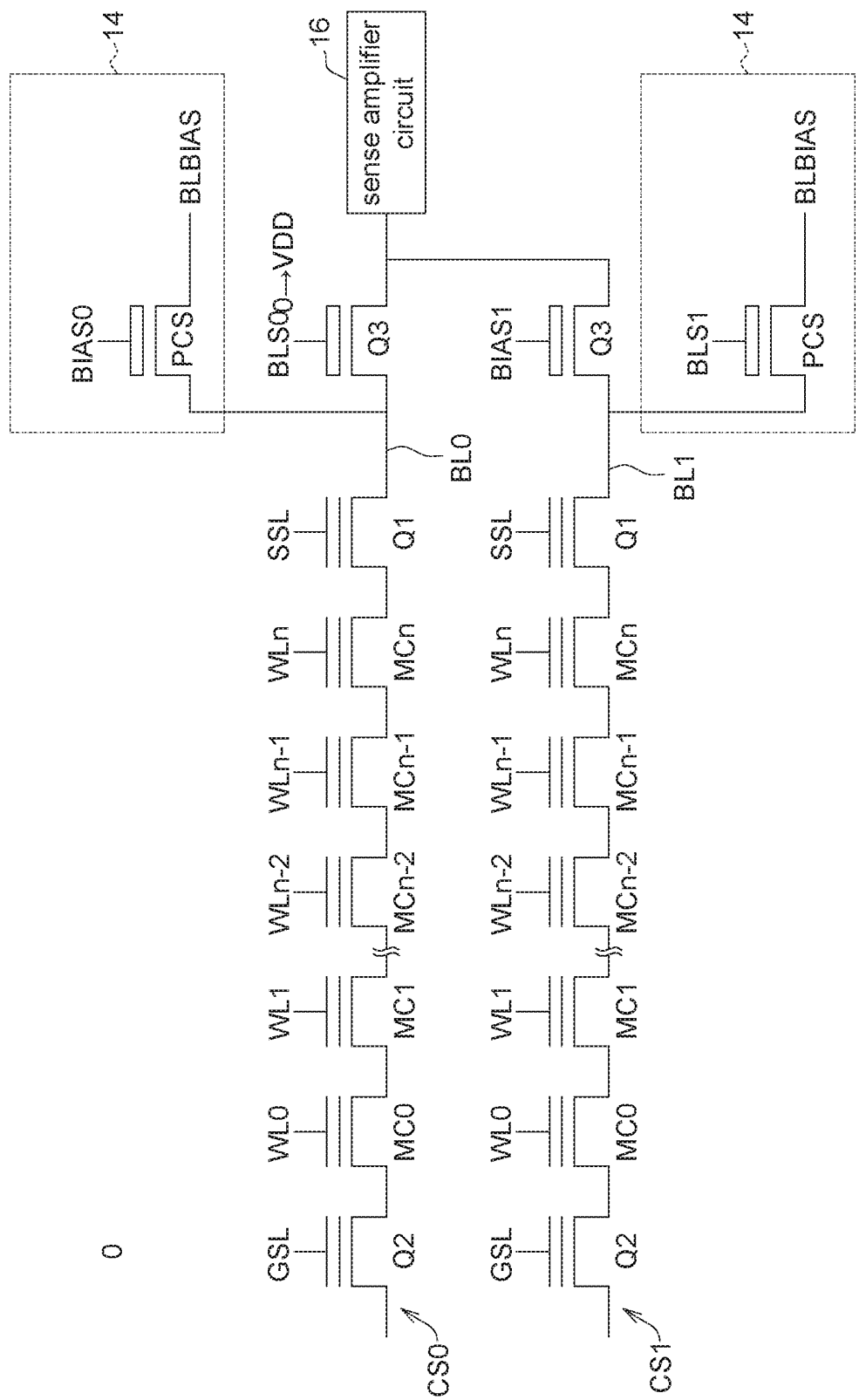
FIG. 6 shows a block diagram of partition of a memory device according to second embodiment of the present invention.

In memory device 1b, each sense amplifier circuit 16 is coupled to two bit lines BL0, BL1. Each bit line BL0, BL1 is coupled to a memory cell string CS0, CS1. That is, the sense amplifier circuit 16 is coupled to two memory cell strings CS0, CS1 through two bit lines BL0, BL1, the details are shown in FIG. 6. The memory cell strings are portioned into first group and second group, e.g., according to odd or even. The third select transistors Q3 coupled to the memory cell strings CS0 of the first group are controlled by a first bit line select signal BLS0, and the third select transistors Q3 coupled to the memory cell strings CS1 of the second group are controlled by a second bit line select signal BLS1. The pre-charge switch PCS coupled to the memory cell strings CS0 of the first group are controlled by a first switch control signal BIAS0, and the pre-charge switch PCS coupled to the memory cell strings CS1 of the second group are controlled by a second switch control signal BIAS1. In the embodiment, the first bit line select signal BIAS0 is different from the second bit line select signal BIAS1, so that the memory cell string CS0 of the first group and the memory cell string CS1 of the second group may not be selected at the same time.

Figure 7:
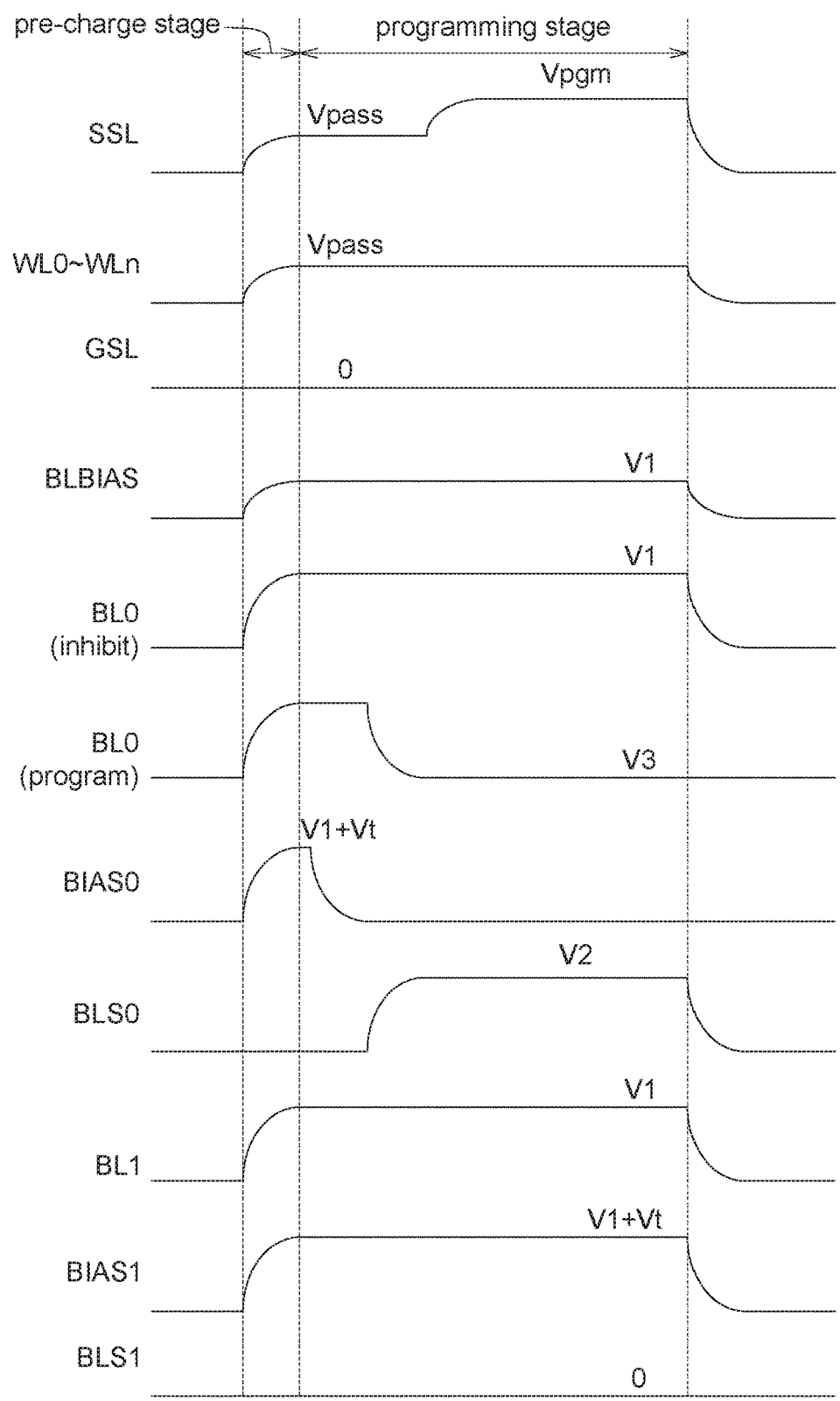
FIG. 7 shows a timing diagram of a memory device according to second embodiment of the present invention.

Referring to FIG. 7, FIG. 7 shows a timing diagram of a memory device according to second embodiment of the present invention. During the pre-charging stage, the voltage source is turned on, and the voltage BLBIAS of the first node of the pre-charge switch PCS is raised from low potential to the first voltage V1. The first switch control signal BIAS0 and the second switch control signal BIAS1 are raised from low potential to high potential to turn on the pre-charge switches PCS. The first bit line select signal BLS0 and the second bit line select signal BLS1 are kept low potential to keep the third select transistors Q3 off. The string select line SSL and the word lines WL0~WLn is applied the pass voltage Vpass. When the voltage of the memory cell strings CS0 of the first group and the memory cell strings CS1 of the second group (i.e., the voltage of the bit lines BL0 and bit lines BL1) have raised to the first voltage V1, the pre-charging is done.

Without losing generality, it is assumed that the memory cell strings CS0 of the first group are going to be selected, and the memory cell strings CS1 of the second group are not going to be selected.

During the programming stage, the first switch control signal BIAS0 is reduced from high potential to low potential to turn off the pre-charge switches PCS corresponding to the memory cell strings CS0 of the first group. The second switch control signal BIAS1 is kept low potential to keep the pre-charge switches PCS corresponding to the memory cell strings CS1 of the second group on. Then, the first bit line select signal BLS0 is raised from low potential to high potential to turn on the third select transistors Q3 corresponding to the memory cell strings CS0 of the first group. The second bit line select signal BLS1 is kept high potential to keep the third select transistors Q3 corresponding to the memory cell strings CS1 of the second group off. For those memory cell strings to be inhibited of the memory cell strings CS0 of the first group (i.e., the threshold voltage of the corresponding first select transistors Q1 are higher than or equal to the threshold value), the sense amplifier circuit 16 provides the second voltage V2, so that the voltage of the corresponding bit lines BL0 may be kept the first voltage V1. For those memory cell strings to be programmed of the memory cell strings CS0 of the first group (i.e., the threshold voltage of the corresponding first select transistors Q1 are lower than the threshold value), the sense amplifier circuit 16 provides the third voltage V3, so that the voltage of the corresponding bit lines BL0 may be reduced to the third voltage V3. Then, the string select line SSL is applied the program voltage Vpgm to program the first select transistors to be programmed. Since the corresponding third select transistors are kept off, the voltage of the bit lines BL1 are able to be kept the first voltage V1. That is, the first select transistors Q1 of the memory cell strings CS1 of the second group are inhibited.

The memory devices 1a, 1b, for example, are non-volatile memory (NVM). The third select transistors may be NMOS-FET or PMOSFET. The control circuit 18 may include a number of sub-circuits to provide the signals. Besides, in some embodiments, the number of the first select transistors Q1 may be two or more.

In conclusion, during the pre-charging stage, the pre-charge circuits provide a high voltage pre-charge path to pre-charge the memory cell strings by the first voltage. During the programming stage, for the memory cell strings to be inhibited, the sense amplifier circuits provide the second voltage; for the memory cell strings to be programmed, the sense amplifier circuits provide the third voltage. Based on the first voltage is higher than the second voltage, and the second voltage is higher than the third voltage, it is possible to adjust the threshold voltage of the first select transistors efficiently, and to make more threshold of the first select transistors to meet the requirement. Additionally, since the difference between the voltage of the string select line and the bit line is reduced, the probability of the threshold voltage fluctuation of the first selected transistor Q1 is reduced thereby.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a memory array, comprising a plurality of memory blocks, each of the memory blocks comprising a plurality of memory cell strings, each of the memory cell strings comprising at least one first select transistor and a second select transistor, at least one memory cell disposed in series between the at least one first select transistor and the second select transistor;
   a plurality of bit lines, each of the bit lines comprising a third select transistor, each of the bit lines coupled to one of the memory cell strings;
   a plurality of pre-charge circuits, coupled to the memory cell strings; and
   a plurality of the sense amplifier circuits, coupled to the memory cell strings through the bit lines;
   wherein during a pre-charging stage, the pre-charge circuits pre-charge the memory cell strings by a first voltage; during a programming stage after the pre-charging stage, for the memory cell strings to be inhibited, the sense amplifier circuits corresponding to the memory cell strings to be inhibited provide a second voltage, for the memory cell strings to be programmed, the sense amplifier circuits corresponding to the memory cell strings to be programmed provide a third voltage, the first voltage is higher than the second voltage, and the second voltage is higher than the third voltage.

2. The memory device according to claim 1, wherein each sense amplifier circuit is coupled to one of the memory cell strings.

3. The memory device according to claim 2, wherein each of the pre-charge circuits comprises a pre-charge switch, each of the pre-charge switches is a high voltage transistor, a first node of each of the pre-charge switches is coupled to a voltage source, a second node of each of the pre-charge switches is coupled to one of the memory cell strings, and each of the third select transistors is a high voltage transistor,
   wherein during the pre-charging stage, the third select transistors are turned off, the pre-charge switches are turned on; during the programming stage, the third select transistors are turned on, and the pre-charge switches are turned off.

4. The memory device according to claim 1, wherein each of the sense amplifier circuits is coupled to two of the memory cell strings.

5. The memory device according to claim 4, wherein each of the pre-charge circuits comprises a pre-charge switch, each of the pre-charge switches is a high voltage transistor, a first node of each of the pre-charge switches is coupled to a voltage source, a second node of each of the pre-charge switches is coupled to one of the memory cell strings, and each of the third select transistors is a high voltage transistor,
   wherein during the pre-charging stage, the third select transistors are turned off, the pre-charge switches are turned on; during the programming stage, some of the pre-charge switches are turned off, some of the pre-charge switches are kept on, the third select transistors corresponding to the pre-charge switches that are turned off are kept on, the third select transistors corresponding to the pre-charge switches that are kept on are turned off.

6. An operation method of memory device, the operation method applied to operate a memory device comprising a plurality of memory cell strings and a plurality of sense amplifier circuit, the operation method comprising:

during a pre-charging stage, pre-charging the memory cell strings by a first voltage; and during a programming stage, for the memory cell strings to be inhibited, the corresponding sense amplifier circuits providing a second voltage, for the memory cell strings to be programmed, the corresponding sense amplifier circuits providing a third voltage, wherein the first voltage is higher than the second voltage, and the second voltage is higher than the third voltage.

7. The operation method according to claim 6, wherein each sense amplifier circuit is coupled to one of the memory cell strings.

8. The operation method according to claim 7, wherein the pre-charging is performed by a plurality of pre-charge circuits, each of the pre-charge circuits comprises a pre-charge switch, and each of the pre-charge switches is coupled to one of the memory cell strings and a third select transistor of a bit line, wherein during the pre-charging stage, the third select transistors are turned off, the pre-charge switches are turned on; during the programming stage, the third select transistors are turned on, and the pre-charge switches are turned off.

9. The operation method according to claim 6, wherein each sense amplifier circuit is coupled to two of the memory cell strings.

10. The operation method according to claim 9, wherein the pre-charging is performed by a plurality of pre-charge circuits, each of the pre-charge circuits comprises a pre-charge switch, and each of the pre-charge switches is coupled to one of the memory cell strings and a third select transistor of a bit line, wherein during the pre-charging stage, the third select transistors are turned off, the pre-charge switches are turned on; during the programming stage, some of the pre-charge switches are turned off, some of the pre-charge switches are kept on, the third select transistors corresponding to the pre-charge switches that are turned off are kept on, the third select transistors corresponding to the pre-charge switches that are kept on are turned off.

* * * * *